(12) United States Patent
Ito et al.

(10) Patent No.: US 7,923,178 B2
(45) Date of Patent: Apr. 12, 2011

(54) GLASS SUBSTRATE FOR MASK BLANK AND METHOD OF POLISHING FOR PRODUCING THE SAME

(75) Inventors: Masabumi Ito, Tokyo (JP); Hiroshi Kojima, Fukushima (JP)

(73) Assignee: Asahi Glass Company, Limited, Tokyo (JP)

( * ) Notice: Subject to any disclaimer, the term of this patent is extended or adjusted under 35 U.S.C. 154(b) by 237 days.

(21) Appl. No.: 12/143,928

(22) Filed: Jun. 23, 2008

(65) Prior Publication Data

US 2008/0311487 A1 Dec. 18, 2008

(30) Foreign Application Priority Data

Dec. 22, 2005 (JP) ................. P2005-370659

(51) Int. Cl.
*G03F 1/00* (2006.01)
*B24B 1/00* (2006.01)
*C03C 17/00* (2006.01)
*C03C 19/00* (2006.01)

(52) U.S. Cl. ................. 430/5; 451/36; 451/41; 65/60.1; 65/61

(58) Field of Classification Search ................. 430/5, 30; 428/428, 430; 378/35; 65/60.1, 61; 451/36, 451/41

See application file for complete search history.

(56) References Cited

U.S. PATENT DOCUMENTS

| | | | |
|---|---|---|---|
| 5,926,352 A | 7/1999 | Murayama et al. | |
| RE41,220 E * | 4/2010 | Davis Jr. et al. | 378/84 |
| 7,732,101 B2 * | 6/2010 | Koike et al. | 430/4 |
| 2004/0035153 A1 | 2/2004 | Koike et al. | |
| 2005/0074635 A1 * | 4/2005 | Mitani et al. | 428/694 ST |
| 2007/0066066 A1 | 3/2007 | Kojima et al. | |

FOREIGN PATENT DOCUMENTS

| | | |
|---|---|---|
| JP | 2003-505891 | 2/2003 |
| JP | 2003-211351 | 7/2003 |
| JP | 2005-275388 | 10/2005 |
| WO | WO 01/07967 | 2/2001 |
| WO | WO 2005/123857 | 12/2005 |

OTHER PUBLICATIONS

U.S. Appl. No. 12/631,004, filed Dec. 4, 2009, Kojima, et al.
U.S. Appl. No. 12/635,872, filed Dec. 11, 2009, Kojima, et al.

* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

The present invention aims at providing a glass substrate required to have a surface polished with extremely high accuracy as in glass substrates for reflective masks for use in EUVL; and a polishing method for producing the glass substrate. The present invention provides a glass substrate for mask blank, which is a glass substrate comprising $SiO_2$ as a main component and having a polished main surface, wherein concave defects and convex defects on the main surface have a depth of 2 nm or smaller and a height of 2 nm or smaller, respectively, and have a half-value width of 60 nm or smaller, so that the concave defects and/or the convex defects do not cause phase defects when the glass substrate is used to produce a mask for exposure and the mask is used. Also disclosed are a polishing method for producing the glass substrate, and a mask blank and a mask for exposure using the glass substrate.

20 Claims, 2 Drawing Sheets

GLASS SUBSTRATE FOR MASK BLANK AND METHOD OF POLISHING FOR PRODUCING THE SAME

TECHNICAL FIELD

The present invention relates to a glass substrate for mask blank and a method of polishing for producing the glass substrate. More particularly, the invention relates to a glass substrate suitable for use in producing a reflective mask or the like for use in EUV (extreme ultra violet) lithography in a semiconductor device production step, and to a method of polishing for producing the substrate.

BACKGROUND ART

In lithographic techniques, exposure apparatus for transferring a fine circuit pattern to a wafer to produce an integrated circuit have been used extensively. With the trend toward higher degrees of integration, higher speeds, and higher functions in integrated circuits, the scale down of integrated circuits proceeds. Exposure apparatus are required to form a circuit pattern image having high resolution on a wafer surface at a large focal depth, and wavelength reduction in exposure light proceeds. Besides g-line (wavelength, 436 nm), i-line (wavelength, 365 nm), and KrF excimer lasers (wavelength, 248 nm), which have been used as light sources, ArF excimer lasers (wavelength, 193 nm) are coming to be employed as light sources having an even shorter wavelength. Furthermore, use of an $F_2$ laser (wavelength, 157 nm) for coping with next-generation integrated circuits having a circuit line width of 100 nm or small is expected to be effective. However, even this technique is considered to cope with only up to the generation having a line width of 70 nm.

Under these technical circumstances, a lithographic technique employing EUV light (extreme ultraviolet light) is attracting attention as a next-generation exposure light applicable to the 45-nm and succeeding generations. The term "EUV light" means a light having a wavelength in the soft X-ray region or vacuum ultraviolet region, specifically a light having a wavelength of about 0.2-100 nm. At present, use of a lithographic light source of 13.5 nm is being investigated. The exposure principle of the EUV lithography (hereinafter abbreviated as "EUVL") is equal to that of conventional lithography in that a mask pattern is transferred with an optical projection system. However, a refractive optical system cannot be used because there is no material which is light-transmitting in the EUV light energy region, and a reflective optical system should be used (see patent document 1).

The mask for use in EUVL is constituted basically of (1) a substrate, (2) a reflective multilayer film formed on the substrate, and (3) an absorber layer formed on the reflective multilayer film. As the reflective multilayer film used is a film having a structure composed of two or more materials which differ in refractive index at the wavelength of the exposure light and are periodically superposed on the order of nanometer. Typical known materials are molybdenum and silicon. For the absorber layer, use of tantalum and chromium is being investigated. With respect to the substrate, the material thereof is required to have a low coefficient of thermal expansion so as not to deform even upon irradiation with EUV light, and use of a glass or crystallized glass having a low coefficient of thermal expansion is being investigated. The substrate is produced by highly accurately polishing a raw material which is such a glass or crystallized glass and washing the polished material.

Methods for polishing a substrate for magnetic recording media, a substrate for semiconductors, or the like to impart high smoothness are generally known. For example, patent document 2 discloses the finish polishing of a memory hard disk and the polishing of a substrate for semiconductor elements. Specifically, it discloses a polishing method for obtaining a polished work which has reduced surface roughness and in which surface defects such as minute projections (small bumps and small particles) and polishing damages (pits and scratches) have been diminished. This method comprises polishing a raw substrate with a polishing liquid composition which comprises water, an abrasive material, and an acid compound and has a pH in an acid region and an abrasive material concentration lower than 10% by weight. That patent document enumerates aluminum oxide, silica, cerium oxide, zirconium oxide, and the like as examples of the abrasive material and nitric acid, sulfuric acid, hydrochloric acid, organic acids, and the like as examples of an acid for use in pH adjustment to a value in an acid region.

Furthermore, patent document 3 discloses a glass substrate for mask blank which has a surface inhibited from having minute protruded surface defects and a polishing method for producing this substrate. In this glass substrate, the height of the protruded surface defects has been regulated to such a value (e.g., smaller than 2 nm) that the defects do not cause phase defects when a mask for exposure produced from this glass substrate is used. The polishing method comprises mirror-polishing a main surface of a glass substrate with a polishing pad while supplying a silica-containing slurry, and the slurry to be used is one from which coarse particles having a particle diameter of 1,000 nm or larger formed by silica aggregation have been removed. There is a statement in that patent document that the slurry is preferably regulated so as to be alkaline.

Patent Document 1: JP-T-2003-505891
Patent Document 2: JP-A-2003-211351
Patent Document 3: JP-A-2005-275388

However, according to the polishing method disclosed in patent document 2, when silica particles are used as the abrasive material, the particle diameter thereof is regulated so as to be in the wide range of 1-600 nm, especially preferably in the range of 20-200 nm, in order to improve the rate of polishing. From the standpoints of the diminution of minute projections and profitability, the concentration of silica particles is regulated to below 10% by weight, most preferably 7% by weight or lower. Namely, it is thought that in patent document 2, the concentration of silica particles is reduced to that level because an increase in silica particle concentration results in an increase in the amount of minute projections and that the diameter of the silica particles is regulated to 1-600 nm for compensating for the reduced concentration to thereby obtain a desired polishing rate. As a result, the surface smoothness of the substrate for magnetic-disk use obtained through polishing with this abrasive material is limited although minute projections have been diminished. Specifically, the surface roughnesses (Ra) in the Examples are 0.2-0.3 nm. To sum up, the degree of polishing obtainable by the polishing method disclosed in patent document 2 is as low as about 0.2-0.3 nm in terms of surface roughness (Ra).

Such a glass substrate having a surface smoothness of 0.2-0.3 nm in terms of surface roughness (Ra) is difficult to use as a glass substrate for reflective masks for use in EUVL, in particular, as a glass substrate required to have exceedingly high surface accuracy and smoothness as in reflective masks for use in the optical system of an exposure apparatus for producing semiconductor devices of the 45-nm and succeeding generations.

On the other hand, in the glass substrate disclosed in patent document 3, the convex defects have a specific height. However, when a main surface of a glass substrate is polished with a polishing pad while supplying a silica slurry, concave defects also are formed in the polished main surface due to fine silica particles and minute foreign matters. In patent document 3, the polishing technique is intended to diminish only the convex defects which are apt to develop because the slurry has been regulated so as to be alkaline from the standpoint of silica stability. However, as long as polishing is conducted with a slurry containing silica, it is difficult to inhibit the development of concave defects. In a glass substrate for mask blank, such concave defects having a depth exceeding a given value can be a cause of phase defects, like convex defects, when a mask for exposure produced from this glass substrate is used.

Besides the height and depth of such convex and concave defects developed on the main surface of a glass substrate, the sizes of the defects in the plane directions (areas) can be a serious problem when the substrate is used as a mask for exposure. The influence thereof becomes larger as the wavelength of the exposure light becomes shorter. The sizes of convex defects and concave defects correlate in some degree with the height of the convex defects and the depth of the concave defects. However, since such defects have various shapes, the sizes thereof cannot be unconditionally determined. This is true especially in concave defects, which differ from convex defects in cause of development. Consequently, the glass substrate of patent document 3, in which the height of convex defects only is specified and neither concave defects nor the sizes of defects are taken into account, cannot be a fully satisfactory substrate for masks for use with an exposure light having a short wavelength, such as EUV light.

DISCLOSURE OF THE INVENTION

The invention has been achieved in view of the problems described above. An object of the invention is to provide a glass substrate required to have a surface polished with extremely high accuracy as in glass substrates for reflective masks for use in EUVL. Another object is to provide a polishing method for producing the glass substrate.

Other objects and effects of the invention will become apparent from the following description.

The present inventors made extensive investigations on polishing for obtaining a glass substrate for a reflective mask usable in the optical system of an exposure apparatus for producing semiconductor devices of the 45-nm and succeeding generations. As a result, they have found that when the pH of a slurry comprising colloidal silica having a small particle diameter and water is regulated so as to be in an acid region and a polishing pad having a nap layer having a high compressibility and a high compressive modulus is used to polish a main surface of a glass substrate, then concave defects and convex defects which are developing on the main surface can be reduced in depth and height, respectively, and in size. The invention has been thus completed.

Namely, the invention provides the following glass substrate having a main surface polished with high accuracy, the following polishing method for producing the substrate, etc.

(1) A glass substrate for mask blank, which is a glass substrate comprising $SiO_2$ as a main component and having a polished main surface, wherein concave defects and convex defects on the main surface have a depth of 2 nm or smaller and a height of 2 nm or smaller, respectively, and have a half-value width of 60 nm or smaller, so that the concave defects and/or the convex defects do not cause phase defects when the glass substrate is used to produce a mask for exposure and the mask is used.

(2) The glass substrate for mask blank of (1) above, wherein the main surface has a surface roughness Rms as determined with an atomic force microscope of 0.15 nm or lower.

(3) The glass substrate for mask blank of (1) or (2) above, which is a glass substrate for a phase shift mask blank for exposure with an ArF excimer laser, a glass substrate for a phase shift mask blank for exposure with an $F_2$ excimer laser, or a glass substrate for a reflective mask blank.

(4) A method of polishing for producing a glass substrate for mask blank, which comprises supplying a polishing slurry comprising colloidal silica having an average primary-particle diameter of 60 nm or smaller and water to a gap between a glass substrate comprising $SiO_2$ as a main component and a nap layer of a polishing pad and polishing a main surface of the glass substrate with the nap layer, wherein the nap layer of the polishing pad has a compressibility of 10% or higher and a compressive modulus of 85% or higher to thereby polish the main surface so that concave defects and convex defects on the polished main surface have a depth of 2 nm or smaller and a height of 2 nm or smaller, respectively, and have a half-value width of 60 nm or smaller.

(5) The polishing method of (4) above, wherein the polishing slurry has a pH in the range of 0.5-4.

(6) The polishing method of (4) or (5) above, wherein the polishing pad comprises a base to which the nap layer is attached.

(7) The polishing method of (4), (5), or (6) above, wherein the colloidal silica has an average primary-particle diameter smaller than 20 nm.

(8) The polishing method of any one of (4) to (7) above, wherein the polishing slurry further comprises an acid, and has a colloidal-silica content of 10-30% by mass.

(9) The polishing method of any one of (4) to (8) above, wherein the water is pure water or ultrapure water in each of which the number of fine particles having a maximum diameter of 0.1 μm or larger, as counted by the light-scattering method employing a laser light, is substantially 1 or smaller per mL.

(10) The polishing method of any one of (4) to (9) above, further comprising washing the polished glass substrate with a solution of a surfactant after the polishing step with the polishing slurry.

(11) The polishing method of any one of (4) to (10) above, further comprising preliminary polishing of the surface of the glass substrate before the polishing step with the polishing slurry.

(12) A mask blank comprising the glass substrate for mask blank of any one of (1) to (3) above.

(13) A mask for exposure produced from the mask blank of (12) above.

According to the invention, a glass substrate polished with high accuracy can be obtained in which the concave defects and convex defects of the polished main surface have been reduced in depth and height, respectively, and in size to such a degree that these defects do not cause phase defects when a mask for exposure produced from this substrate is used. This glass substrate can hence be used to produce therefrom a reflective mask or the like required in exposure apparatus for producing semiconductor devices of the 45-nm and succeeding generations.

Furthermore, according to the invention, a main surface of a glass substrate can be industrially polished with high accuracy by using a polishing slurry comprising colloidal silica having a small particle diameter and water and by using a polishing pad having a nap layer with a high compressive modulus and a high compressibility.

Figure 1:
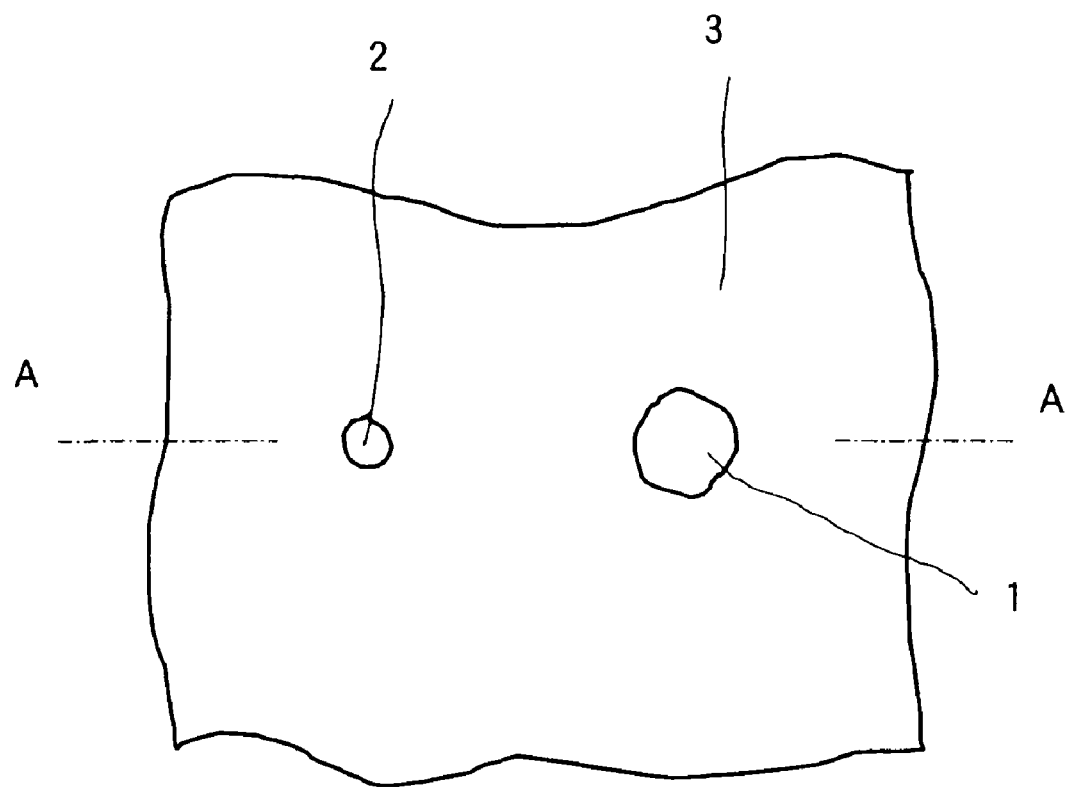
FIG. 1 is an enlarged plan view of one part of a polished glass substrate.

The reference numerals used in the drawings denote the followings, respectively.
1: Concave defect
2: Convex defect
3: Glass substrate
4: Base
5: Nap layer

BEST MODE FOR CARRYING OUT THE INVENTION

The glass to be polished for producing the glass substrate in the invention preferably is a glass having a low coefficient of thermal expansion and reduced variation of the coefficient so as to obtain a glass substrate for mask blank capable of giving, e.g., a reflective mask for EUVL with which the demand for higher degrees of integration and higher fineness in integrated circuits can be met. Specifically, a low-expansion glass having a coefficient of thermal expansion at 20° C. of 0±30 ppb/° C. is preferred, and an extremely-low-expansion glass having a coefficient of thermal expansion at 20° C. of 0±10 ppb/° C. is especially preferred. More preferred is an extremely-low-expansion glass having a coefficient of thermal expansion at 20° C. of 0±5 ppb/° C. As long as the reflective mask or the like comprises a glass having such a low coefficient of thermal expansion, it sufficiently copes with temperature changes in semiconductor device production steps and can satisfactorily transfer a circuit pattern with high resolution.

As the low-expansion glass and the extremely-low-expansion glass, a glass comprising $SiO_2$ as the main component can be used. Typically, a quartz glass can be used. Examples thereof include low-expansion glasses or low-expansion crystalline glasses such as a synthetic quartz glass comprising $SiO_2$ as the main component and containing $TiO_2$, ULE (registered trademark; Corning code 7972), and ZERODUR (registered trademark of Schott AG, Germany). Although the glass substrate is usually polished in the form of a square plate, the shape thereof is not limited thereto.

In the invention, a main surface of the glass substrate is finish-polished with a polishing pad while supplying a polishing slurry (hereinafter referred to as slurry) which comprises colloidal silica and water and has a pH of 0.5-4. By this polishing, the main surface of the glass substrate is polished to give a mirror surface. However, the main surface thus polished often has ultrafine concave defects and convex defects formed during the polishing. These defects will be explained next.

Figure 2:
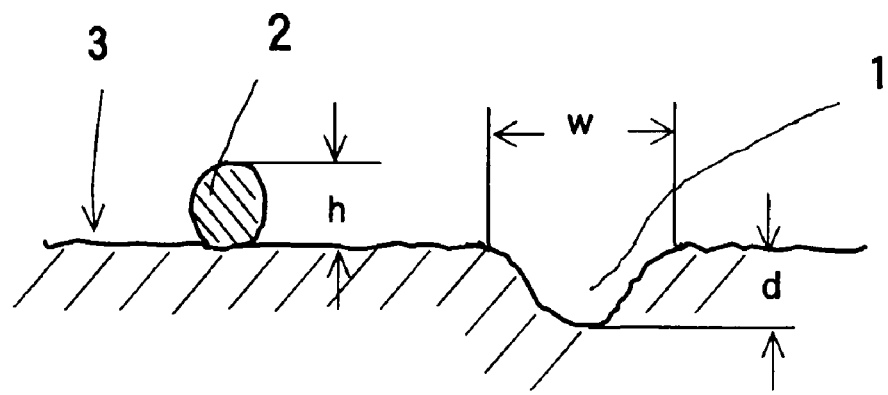
FIG. 2 is a diagrammatic sectional view taken on the line A-A in FIG. 1.

FIG. 1 diagrammatically shows part of the surface of a glass substrate for mask blank (hereinafter often referred to as glass substrate) which has been finish-polished with the slurry and then washed and is examined with, e.g., surface inspection apparatus M1350 (manufactured by Lasertec Corp.). FIG. 2 is a diagrammatic sectional view taken on the line A-A of FIG. 1. As shown in FIG. 1 and FIG. 2, the surface of the glass substrate 3 which has been polished and washed has a concave defect 1 and a convex defect 2 besides a general surface roughness Rms. In FIG. 2, d indicates the depth of the concave defect 1 and h indicates the height of the convex defect 2.

Concave defects 1 are formed mainly by silica particles in the course of the polishing by silica particles contained in the slurry with a polishing pad. Namely, it is thought that when the slurry contains, e.g., silica particles having a large particle diameter or aggregates of fine silica particles and the polishing pressure imposed on these silica particles through the polishing pad cannot be sufficiently dispersed in the nap layer, then the polishing pressure is concentrated to form concave defects 1. Consequently, the development of concave defects 1 is governed by the particle size and content of silica particles in the slurry, properties of the nap layer of the polishing pad to be used, etc. With respect to silica particles, there is a tendency that the larger the size of the silica particles, the more the concave defects 1 become deep and large (in area) and increase in number. Since the concave defects 1 have been formed in the glass substrate 3, they are permanent defects which cannot be removed by washing. There is a possibility that such concave defects having a depth and size not smaller than given values might bring about an increased phase angle change to cause phase defects when a mask for exposure produced from this glass substrate is used especially with an exposure light having a short wavelength.

On the other hand, the convex defect 2 is a projection formed by the tenacious adhesion of a silica particle or an impurity (foreign matter) or the like contained in the slurry to the main surface of the glass substrate. Unlike the concave defect 1, this convex defect 2 can be removed in some degree by changing the method of washing or by washing the main surface with washing water from which foreign matters have been sufficiently removed. Furthermore, by acidifying the slurry containing silica particles as will be described later, the development of convex defects 2 itself can be diminished. However, once silica particles adhere to the glass surface, complete removal thereof by washing is difficult because the silica particles have high adhesion. Part of these silica particles remain as defects.

In the glass substrate for mask blank of the invention, the depth d of the concave defect 1 and the height h of the convex defect 2 each are 2 nm or smaller, preferably 1 nm or smaller. It is a matter of course that the smaller the values of d and h, the more the glass substrate is preferred. However, as long as the values of d and h are 2 nm or smaller, this coupled with the defect size described later can substantially prevent the generation of phase defects when a mask for exposure produced from this glass substrate is used in exposure even to an EUV light having a wavelength of, e.g., about 0.2-100 nm. Incidentally, the depth d of the concave defect 1 and the height 2 of the convex defect 2 can be measured with an atomic force microscope (hereinafter referred to as AFM), e.g., SPA 400, manufactured by Seiko Instrument Inc.

Furthermore, in the glass substrate for mask blank of the invention, the plane-direction sizes of the concave defect 1 and convex defect 2 should be 60 nm or smaller in terms of half-value width. Preferably, the half-value width is 30 nm or smaller. In the invention, the term "sizes of concave defects 1 and convex defects 2" means this plane-direction size unless otherwise indicated. The reason why the sizes of concave defects 1 and convex defects 2 are specified in terms of half-value width is that the concave defects 1 and the convex defects 2 in the invention have been specified by means of depth and height, respectively, and the use of half-value width is superior because the half-value width enables the sizes of these defects to be specified in relation to the depth or height.

Figure 3:
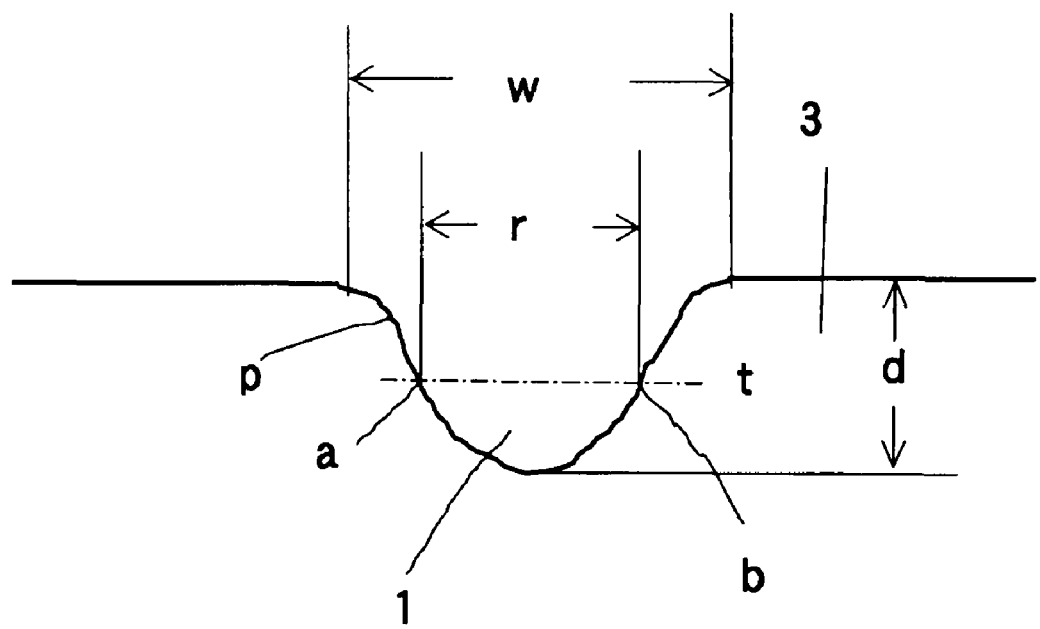
FIG. 3 is a diagrammatic sectional view illustrating the concave defect shown in FIG. 2.

Next, the half-value width of the concave defect 1 is explained in detail by reference to FIG. 3. FIG. 3 is a diagrammatic enlarged sectional view of the concave defect 1 shown in FIG. 2. In general, the concave defect 1 formed in the main surface of the glass substrate 3 is an approximately semispherical concave and, hence, its plane shape is nearly circular. Consequently, a parabolic curve p is determined from the diameter w of an approximate circle obtained from that plane shape of the concave defect 1 and from the depth d of the concave defect 1. When the intersections of this parabolic curve p and a straight line t extending along a half depth, i.e., d/2, are expressed as a and b, then the half-value width r of the concave defect 1 can be obtained as the distance between a and b. To specify the size of the concave defect 1 in terms of the half-value width r by the method described above is preferred because the plane shape of the concave defect 1 can be advantageously related to the sectional shape thereof. In the case where the half-value width r is larger than 60 nm, the concave defect 1 exerts an enhanced influence when this glass substrate is used as a mask for exposure, resulting in a possibility that a phase defect might appear.

The size of the convex defect 2 also can be specified in terms of half-value width, although this is not shown in the figure. Namely, the plane shape of the convex defect 2 can be determined as a projected figure and, hence, the sectional shape of the convex defect 2 is likewise determined as a parabolic curve from the diameter of the projected approximate circle and the height h. Thus, the half-value width of the convex defect 2 is obtained as the distance between the intersections of this parabola and a straight line extending along a half height, i.e., h/2.

In the glass substrate of the invention, the proportion of concave defects 1 to convex defects 2 varies in a wide range depending especially on whether the slurry containing silica particles is made acid or alkaline. Specifically, in the case where the slurry which has been acidified by adding an acid thereto so as to result in a pH of, e.g., 4 or lower is used for polishing, even when silica particles adhere to the glass substrate, the silica particles which have adhered are removed by the mechanochemical polishing action of the slurry. In addition, the adhesion of the silica particles is weakened by the acid and, hence, the silica particles are apt to be removed in the steps of polishing and washing. Because of this, when the glass substrate is polished with the slurry containing an acid, the proportion of convex defects 2 to concave defects 1 can be made extremely small. In contrast, when the slurry is alkaline or neutral, the proportion of convex defects 2 increases. It is preferred in the invention that the proportion of convex defects 2 to concave defects 1 be as small as possible. This is because convex defects 2 exert a higher influence on phase defects when a mask for exposure is used.

The glass substrate is satisfactory when the main surface thereof has substantially no concave defects 1 having a depth d exceeding 2 nm and no convex defects 2 having a height h exceeding 2 nm. For example, when the number of such defects is up to about 3 per 142 mm×142 mm range, this glass substrate may be practically allowable in some cases.

Furthermore, the glass substrate of the invention preferably is one in which the surface roughness Rms of the main surface as determined with an atomic force microscope (hereinafter referred to as AFM) is 0.15 nm or lower. The Rms is more preferably 0.10 nm or lower. Here, SPA 400, manufactured by Seiko Instrument Inc., is used as the AFM. In the case where the surface roughness Rms of the glass substrate is higher than 0.15 nm, there is a possibility that this glass substrate cannot have sufficient functions when used as a part for the optical system of an exposure apparatus for producing semiconductor devices of the 45-nm and succeeding generations, for which higher degrees of integration and higher fineness are more strongly desired.

As stated above, the glass substrate having a main surface which has been finely mirror-polished can be sufficiently used as a part for the optical system of an exposure apparatus for producing semiconductor devices of the 45-nm and succeeding generations. In particular, the glass substrate is superior as a glass substrate for a phase shift mask blank for exposure with an ArF excimer laser, a glass substrate for a phase shift mask blank for exposure with an $F_2$ excimer laser, a glass substrate for a reflective mask blank, or the like.

The method of glass substrate polishing of the invention is explained next. A glass substrate is polished with a polishing slurry comprising colloidal silica (silica particles) and water and having a pH regulated to a value in the range of preferably 0.5-4, more preferably 1-4. Namely, in the invention, a glass substrate is polished with a polishing slurry which comprises colloidal silica as an abrasive material, an acid for pH regulation, and water for slurrying. The average primary-particle diameter of the colloidal silica is 60 nm or smaller, preferably smaller than 20 nm, more preferably smaller than 15 nm. Although there is no particular lower limit of the average primary-particle diameter of the colloidal silica, the average primary-particle diameter thereof is preferably 5 nm or larger, more preferably 10 nm or larger, from the standpoint of improving the efficiency of polishing. In the case where the average primary-particle diameter of the colloidal silica exceeds 60 nm, concave defects having a depth larger than 2 nm are apt to be generated during polishing and it is difficult to polish the glass substrate to a desired surface roughness. It is therefore difficult to obtain a glass substrate which is suitable for use as, e.g., a part for the optical system of an exposure apparatus for producing semiconductor devices of the 45-nm and succeeding generations. Reducing the particle diameter of the colloidal silica results in a decrease in polishing efficiency. However, the smaller the particle diameter, the more the colloidal silica is effective in reducing the size and number of concave defects and in reducing the surface roughness Rms.

From the standpoint of strictly regulating the particle diameter, the colloidal silica preferably is one in which the content of secondary particles formed by the aggregation of primary particles is as low as possible. When the colloidal silica includes secondary particles, the average particle diameter of these particles is preferably 70 nm or smaller. The particle diameter of colloidal silica in the invention is one obtained through an examination of images having a magnification of (15 to 105)×$10^3$ diameters obtained with an SEM (scanning electron microscope).

In the polishing slurry, the content of colloidal silica is preferably 10-30% by mass, more preferably 18-25% by mass, especially preferably 18-22% by mass. Colloidal silica contents lower than 10% by mass are undesirable because the efficiency of polishing decreases and this results in a prolonged polishing time. Especially in the invention, since colloidal silica having a small average primary-particle diameter is employed as an abrasive material as stated above, colloidal silica contents lower than 10% by mass result in an impaired polishing efficiency and this may make economical polishing impossible. On the other hand, in the case where the content of colloidal silica exceeds 30% by mass, not only the silica particles are apt to be unevenly distributed during polishing but also the amount of the colloidal silica to be used increases necessarily, although an improvement in polishing efficiency is obtained. Consequently, such too high contents of colloidal silica are undesirable from the standpoints of profitability, washability, etc.

As stated above, the pH of the polishing slurry in the invention has been regulated to preferably 0.5-4, more preferably 1-4, further preferably 1-3, especially preferably 1.8-2.5, with an acid. The purpose of such pH regulation of the polishing slurry is substantially the same as that of conventional acid polishing. By thus regulating the polishing slurry so as to be acid, the surface of the glass substrate can be polished chemically and mechanically. Namely, in mechanical polishing with an acid polishing slurry, protruded parts of the glass surface are softened by the acid contained in the polishing slurry and can hence be easily removed by the mechanical polishing. As a result, not only the efficiency of polishing improves but also the glass particles or glass debris removed by the polishing can be prevented from newly forming flaws because such glass debris and the like have been softened. In addition, silica particles can be inhibited from adhering and thereby forming convex defects. Consequently, the method in which the pH of the polishing slurry is regulated so as to be in an acid region is an effective method for efficiently mirror-polishing a glass substrate without developing defects. Especially for the mirror polishing of a glass substrate to be used in a mask for short-wavelength exposure which is required in exposure apparatus for producing semiconductor devices of the 45-nm and succeeding generations, this technique of acid polishing is superior in the ability to inhibit the generation of convex defects and attain fine mirror polishing.

With respect to the pH regulation of the polishing slurry, in the case where the pH is lower than 0.5, the acidity is too high and this may pose a problem concerning polishing machine corrosion. In the case where the pH is lower than 1.0, the polishing slurry tends to have poor handleability although such pH values are on a level where the problem concerning polishing machine corrosion does not arise. Consequently, the pH of the polishing slurry is preferably 1 or higher from the standpoint of practical use. On the other hand, pH values higher than 4 are not desirable because this tends to decrease the effect of chemically polishing glasses as described above and increase convex defects generated due to silica adhesion.

In the invention, the pH regulation of the polishing slurry can be conducted by using one acid or a combination of two or more acids selected from inorganic acids or organic acids. For convenience, one or more acids suitably selected from many inorganic acids or organic acids known as pH regulators for polishing slurries for acid polishing can be used. Examples of the inorganic acids include nitric acid, sulfuric acid, hydrochloric acid, perchloric acid, and phosphoric acid. Of these, nitric acid is preferred from the standpoint of handleability. Acids which highly corrode glasses, such as hydrofluoric acid, cannot be used because such acids make mars conspicuous. Examples of the organic acids include oxalic acid and citric acid.

The water to be used in the invention for the concentration regulation or slurrying of colloidal silica preferably is pure water or ultrapure water from which foreign matters have been removed. Namely, foreign matters (fine particles) are removed regardless of the material or shape thereof, and it is preferred to use pure water or ultrapure water in each of which the number of fine particles having a maximum diameter of 0.1 µm or larger, as counted by the light-scattering method employing a laser light or the like, is substantially 1 or smaller per mL. In the case where the number of 0.1-µm or larger foreign particles contained in the water is larger than 1 per mL, these foreign particles act as a kind of abrasive material during polishing to cause surface defects such as scratches and pits on the glass surface being polished and, hence, a high-quality mirror-polished surface is difficult to obtain. The diameter of such foreign matters that could be present in the water for use in the present invention is at most 10 µm. Foreign matters in the water can be removed, for example, by filtration or ultrafiltration with a membrane filter. However, methods for the removal should not be construed as being limited to these.

The polishing of a glass substrate in the invention can be conducted while supplying to a polishing apparatus a polishing slurry in which the average primary-particle diameter and concentration of the colloidal silica and the pH have been regulated. As this polishing apparatus, a known one can be used although it is not shown as a figure. For example, the glass substrate is sandwiched under a given load between polishing plates each having a polishing pad attached thereto and the polishing plates are rotated relative to the glass substrate while supplying a given amount of the polishing slurry to each polishing pad, whereby the glass substrate can be polished. In this case, the amount of the polishing slurry to be supplied, polishing load, rotation speed of each polishing plate, etc. are suitably determined while taking account of the rate of polishing, accuracy of the finish of polishing, etc.

The method of polishing of the invention is especially suitable as the final finish polishing in polishing a glass substrate through two or more polishing steps. Consequently, it is preferred that the glass substrate should be subjected, before being polished by the method of the invention, to rough polishing to a given thickness, edge polishing and beveling, and further to preliminary polishing for reducing the surface roughness of the main surface to a given value or below. This preliminary polishing may be conducted by one or more polishing steps. Methods for this polishing are not limited. For example, two or more both-side lapping machines are successively disposed and a glass substrate is polished consecutively with these lapping machines while changing the abrasive material and polishing conditions, whereby the glass substrate can be preliminarily polished so as to have a given thickness and given surface roughness. This surface roughness (Rms) to be attained by the preliminary polishing is, for example, preferably 3 nm or lower, more preferably 1.0 nm or lower, even more preferably 0.5 nm or lower.

Figure 4:
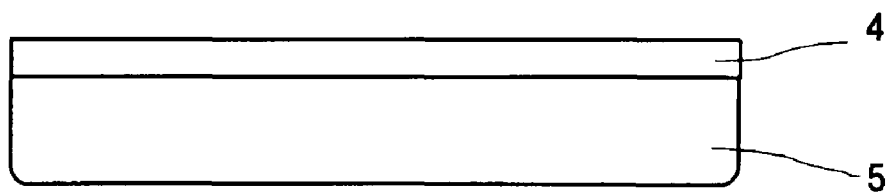
FIG. 4 is a side view of a preferred polishing suede pad for use in the invention.

FIG. 4 illustrates a preferred polishing pad for use in the polishing method of the invention. This polishing pad comprises a base 4 and a nap layer 5 attached thereto. The base 4 comprises a structural material made of, e.g., a nonwoven fabric, sheet-form resin, or the like. The polishing pad, which is constituted of this base 4 and a nap layer 5, is attached to the polishing plate of a polishing apparatus through the base 4. Thus, the polishing pad can be easily attached and removed. It is, however, possible to directly attach the nap layer 5 to the polishing plate of a polishing apparatus. In this case, the base 4 can be omitted. Although the nap layer 5 generally is directly attached to the base 4 with, e.g., an adhesive having chemical resistance, another member may be interposed between the nap layer 5 and the base 4.

The nap layer 5 is a polishing member which comes into contact with a main surface of a glass substrate at a given polishing pressure and finish-polish the main surface of the glass substrate when the polishing pad is rotated (caused to undergo revolution and rotation) relative to the glass substrate while supplying a slurry to a gap between the nap layer 5 and the glass substrate. The pad having a nap layer 5 is classified as a suede pad. The thickness of the nap layer 5 varies depending on the material thereof, etc., and is not limited. However, the thickness thereof in suede pads is preferably about 0.3-1.0 mm from the standpoint of practical use. The nap layer 5 comprises a flexible resin foam having moderate elasticity. For example, resin foams of the ether, ester, or carbonate type or the like are preferably used.

In the invention, the nap layer 5 has a compressibility of 10% or higher, preferably 15-60%, more preferably 30-60%, and a compressive modulus of 85% or higher, preferably 90-100%, more preferably 95-100%. The terms compressibility and compressive modulus herein mean the properties determined by the following examination methods.

A test sample of about 10 cm×10 cm is cut out of the nap layer. A Schopper type thickness meter is used to apply a pressure of 100 g/cm² to the test sample for 30 seconds through a pressing plane having a diameter of 1 cm and measure the thickness $t_0$ of the test sample after the 30-second pressing. Thereafter, a pressure of 1,120 g/cm² is applied to the same part of the test sample for 300 seconds and the thickness $t_1$ of the test sample after the 300-second pressing is measured. After this test sample is allowed to stand for 300 seconds without being pressed, a pressure of 100 g/cm² is applied to the same part of the test sample for 30 seconds and the thickness $t_0'$ of the test sample after the 30-second pressing is measured. The compressibility and compressive modulus of the nap layer are determined from the $t_0$, $t_1$, and $t_0'$ using the following expressions 1 and 2.

$$\text{Compressibility (\%)} = (t_0 - t_1)/t_0 \times 100 \quad (1)$$

$$\text{Compressive modulus (\%)} = (t_0' - t_1)/(t_0 - t_1) \times 100 \quad (2)$$

In the case where the compressibility of the nap layer is lower than 10%, this nap layer is rigid and difficult to deform and hence has the following drawback. In the case where silica particles having a large particle diameter coexist in the slurry or silica particles are unevenly distributed when a main surface of a glass substrate is polished while supplying the slurry, the polishing pressure imposed on these silica particles is not dispersed but concentrated and, hence, concave defects are apt to be generated. When a nap layer having a compressibility of 10% or higher is employed, those silica particles can be inhibited from forming concave defects. This is because when a polishing pressure is imposed on the silica particles, those parts of the nap layer which surround the silica particles deform elastically and thereby disperse and absorb the polishing pressure.

On the other hand, compressibilities of the nap layer exceeding 60% are not desirable because the nap layer during polishing is excessively compressed and deformed and this makes it difficult to conduct uniform polishing and is apt to result in polishing unevenness. In addition, such nap layers are apt to have impaired flatness of the polishing side.

In the case where the compressive modulus of the nap layer is lower than 85%, the silica particles and the like having a large diameter which have been incorporated into the nap layer from the polishing side in contact with the glass substrate due to the elastic deformation of the nap layer, which is flexible, are apt to remain in the nap layer even after the relief of the polishing pressure because of the poor recovery properties of the nap layer. In addition, this nap layer is apt to locally come into contact with the glass substrate at a high pressure and, hence, the glass substrate is apt to develop concave defects. Furthermore, since the properties and flatness of the polishing side of such a nap layer deteriorate with the continuation of polishing, the glass substrate thus polished also has impaired flatness. As long as the compressive modulus of the nap layer is 85% or higher, the nap layer can be easily compressed and readily recovers. Because of this, silica particles having a large particle diameter and the like are less apt to remain in the layer and the pressure imposed on those silica particles incorporated in the layer can be dispersed. Consequently, the generation of concave defects can be diminished or prevented. Thus, a glass substrate having a polished surface with satisfactory flatness can be obtained.

In the invention, the compressibility and compressive modulus of the nap layer comprising a resin foam in the suede pad can be suitably regulated by changing the kind of the resin, open pore diameter, porosity, density, foamed pore diameter, thickness, etc. In the case of a nap layer constituted of a uniform material, i.e., a nap layer whose material and properties are homogenous throughout the nap layer, the compressibility and compressive modulus of this nap layer are even throughout the nap layer. However, in the case of a nap layer constituted of different materials superposed in the thickness direction, the compressibility and compressive modulus of this nap layer mean those of the outermost part of the nap layer which comes into contact with the glass substrate during polishing.

The glass substrate which has been finish-polished by the polishing method of the invention is finally washed. By this washing, the abrasive material, glass debris resulting from polishing, other foreign matters, and the like which are adherent to the polished surface of the glass substrate are removed to clean the glass substrate. In addition, the surface of the glass substrate can be neutralized by the washing. This washing therefore is an important step accompanying the polishing. In the case where this washing is insufficient, not only defects are observed in a subsequent inspection, but also the quality required of the glass substrate cannot be obtained. One preferred method of washing is to wash with a solution of a surfactant. However, methods of washing should not be construed as being limited thereto, and other methods may be used.

EXAMPLES

The present invention will be illustrated in greater detail with reference to the following Examples, but the invention should not be construed as being limited thereto.

Reference Example

An ingot of a synthetic quartz glass containing 7% by mass $TiO_2$ and produced by the flame hydrolysis method was cut into a platy shape having dimensions of 153.0 mm (width)× 153.0 mm (length)×6.75 mm (thickness) with an inner diameter saw slicer to produce sixty platy samples of the synthetic quartz glass (hereinafter referred to as "sample substrates"). Subsequently, these sample substrates were beveled with a commercial NC beveling machine and #120 diamond wheels so as to result in shape dimensions of 152 mm (width) by 152 mm (length) and a beveling width of 0.2-0.4 mm.

These sample substrates were preliminarily polished by the following method. Namely, using a 20B both-side lapping machine manufactured by Speedfam Co., Ltd. and a slurry prepared by suspending 18-20% by mass GC #400 (manufactured by Fujimi Inc.) consisting substantially of SiC as an abrasive material in filtered water, polishing processing of the main surfaces of the sample substrates was carried out until the thickness of each substrate reached 6.63 mm.

Furthermore, another 20B both-side lapping machine was used to lap the sample substrates with a slurry prepared by suspending 18-20% by mass abrasive material which was FO #1000 (manufactured by Fujimi Inc.) comprising $Al_2O_3$ as the main component, until the thickness of each sample substrate reached 6.51 mm. Thereafter, a slurry mainly comprising cerium oxide and a buff were used to polish the periphery of each sample substrate in an amount of 30 μm and mirror-polish the edges thereof to a surface roughness (Ra) of 0.05 μm.

Subsequently, these sample substrates were subjected to first polishing, in which a 20B both-side polishing machine manufactured by Speedfam Co., Ltd. was used together with LP66 (trade name; manufactured by Rhodes) as a polishing cloth and a slurry containing 10-12% by mass Mirek 801A (trade name; manufactured by Mitsui Mining & Smelting Co., Ltd.) suspended as an abrasive material to polish each sample substrate in an amount of 50 μm on both sides.

Furthermore, in second polishing, a 20B both-side polishing machine was used together with Siegal 7355 (trade name; manufactured by Toray Coatex Co., Ltd.) as a polishing cloth and Mirek 801A, described above, as an abrasive material to polish each sample substrate in an amount of 10 μm on both sides. Thereafter, simple washing was conducted. The sample substrates which had undergone this preliminary polishing had an (Rms) of about 0.8 nm.

Subsequently, the sixty sample substrates which had been preliminarily polished were divided into three groups of twenty substrates each and subjected to finish polishing in the following manner. For the first group was used a polishing slurry comprising colloidal silica having an average primary-particle diameter heretofore in use and water. For the second group was used a polishing slurry prepared by adding nitric acid to a polishing slurry comprising the same colloidal silica as that for the first group and water to regulate the pH thereof to 2. For the third group was used a polishing slurry prepared by adding nitric acid to a polishing slurry comprising colloidal silica having the average primary-particle diameter according to the invention and water to regulate the pH thereof to the same value as for the second group. The methods used for preparing the polishing slurries for the respective groups are shown in Table 1. Except the polishing slurry preparation methods, the same finish polishing conditions were used for all the groups. The conditions are as follows.
Polishing Conditions:
Polishing test machine: both-side 24B polishing machine manufactured by Hamai Co., Ltd.

Polishing pad: Belatrix K7512, manufactured by Kanebo Ltd.

Rotation speed of polishing plate: 35 rpm

Polishing time: 50 min

Polishing load: 80 g/cm$^2$

Diluting water: pure water (specific resistance, 4.2 MΩ·cm; foreign particles of 0.2 μm and larger had been filtered off)

Slurry flow rate: 10 L/min

TABLE 1

|  | First group | Second group | Third group |
| --- | --- | --- | --- |
| pH | 10.2 | 2.0 | 2.0 |
| Content of colloidal silica in polishing slurry | 20 mass % | 20 mass % | 20 mass % |
| Average primary-particle diameter | 62-82 nm | 62-82 nm | 10-20 nm |

After the sample substrates had been subjected to final polishing under the conditions shown above, they were washed with a multistage automatic washing machine including a first tank which was a washing tank containing a surfactant solution and succeeding tanks constituted of a rinsing tank containing ultrapure water and a drying tank containing IPA. The sample substrates thus washed were inspected with a surface defect inspection apparatus for photomasks manufactured by Lasertec Corp. to count the number of defects in a 142 mm×142 mm area. Simultaneously therewith, each defect was judged to be a concave or a convex. In counting the number of defects, the defects were divided into defects of 60-150 nm and defects larger than 150 nm in terms of the size of standard PSL (polystyrene latex) particles.

Furthermore, the substrates were examined for surface roughness with atomic force microscope SPA 400, manufactured by Seiko Instrument Inc. This surface roughness measurement with the atomic force microscope was made by examining one arbitrary area (10 μm×10 μm range). The results of those examinations are shown in Table 2.

TABLE 2

| | First group Alkali polishing | | | | | Second group Acid polishing | | | | | Third group Acid polishing | | | | |
| --- | --- | --- | --- | --- | --- | --- | --- | --- | --- | --- | --- | --- | --- | --- | --- |
| | Convex defects | | Concave defects | | Surface roughness | Convex defects | | Concave defects | | Surface roughness | Convex defects | | Concave defects | | Surface roughness |
| Substrate No. | 60-150 nm | >150 nm | 60-150 nm | >150 nm | Rms (nm) | 60-150 nm | >150 nm | 60-150 nm | >150 nm | Rms (nm) | 60-150 nm | >150 nm | 60-150 nm | >150 nm | Rms (nm) |
| 1 | 2034 | 3 | 11848 | 481 | 0.132 | 5 | 0 | 14956 | 2 | 0.123 | 8 | 1 | 3 | 0 | 0.094 |
| 2 | 1243 | 14 | 6752 | 542 | 0.139 | 7 | 2 | 8354 | 0 | 0.134 | 6 | 0 | 2 | 0 | 0.096 |
| 3 | 3327 | 4 | 4927 | 346 | 0.122 | 6 | 0 | 2438 | 1 | 0.142 | 5 | 0 | 0 | 0 | 0.101 |
| 4 | 1892 | 0 | 7557 | 386 | 0.126 | 3 | 0 | 6453 | 2 | 0.128 | 4 | 0 | 0 | 1 | 0.098 |
| 5 | 2884 | 22 | 15284 | 689 | 0.128 | 11 | 1 | 5498 | 0 | 0.119 | 9 | 2 | 2 | 0 | 0.094 |
| 6 | 3286 | 18 | 8842 | 407 | 0.133 | 13 | 3 | 7459 | 0 | 0.127 | 3 | 3 | 1 | 0 | 0.108 |
| 7 | 971 | 0 | 8563 | 294 | 0.125 | 3 | 0 | 15438 | 0 | 0.126 | 6 | 0 | 0 | 0 | 0.109 |
| 8 | 2158 | 9 | 12684 | 548 | 0.135 | 7 | 0 | 3248 | 4 | 0.131 | 4 | 1 | 0 | 0 | 0.103 |
| 9 | 1765 | 7 | 7859 | 322 | 0.132 | 5 | 2 | 13004 | 0 | 0.125 | 7 | 1 | 3 | 0 | 0.099 |
| 10 | 3209 | 4 | 13691 | 354 | 0.127 | 3 | 0 | 7689 | 0 | 0.111 | 6 | 0 | 0 | 0 | 0.096 |
| 11 | 4403 | 12 | 3846 | 685 | 0.134 | 2 | 1 | 5465 | 2 | 0.128 | 6 | 0 | 0 | 0 | 0.100 |
| 12 | 2210 | 7 | 4413 | 361 | 0.117 | 2 | 0 | 4853 | 1 | 0.133 | 2 | 0 | 1 | 0 | 0.098 |
| 13 | 2768 | 12 | 15288 | 595 | 0.125 | 8 | 1 | 9655 | 0 | 0.131 | 8 | 0 | 0 | 0 | 0.096 |
| 14 | 4732 | 4 | 13570 | 437 | 0.133 | 3 | 4 | 8572 | 1 | 0.124 | 7 | 1 | 0 | 1 | 0.103 |
| 15 | 1537 | 2 | 9781 | 254 | 0.130 | 1 | 0 | 3375 | 0 | 0.135 | 4 | 2 | 0 | 0 | 0.099 |
| 16 | 6599 | 12 | 7753 | 508 | 0.132 | 5 | 3 | 2138 | 0 | 0.128 | 5 | 0 | 0 | 0 | 0.094 |
| 17 | 2686 | 4 | 14065 | 623 | 0.127 | 7 | 0 | 6417 | 0 | 0.127 | 8 | 1 | 0 | 0 | 0.111 |
| 18 | 864 | 0 | 8946 | 760 | 0.135 | 6 | 0 | 8965 | 2 | 0.134 | 4 | 0 | 1 | 0 | 0.102 |
| 19 | 1681 | 21 | 6423 | 573 | 0.128 | 7 | 2 | 7854 | 0 | 0.125 | 7 | 1 | 0 | 0 | 0.097 |

TABLE 2-continued

| | First group Alkali polishing | | | | | Second group Acid polishing | | | | | Third group Acid polishing | | | | |
|---|---|---|---|---|---|---|---|---|---|---|---|---|---|---|---|
| | Convex defects | | Concave defects | | Surface roughness | Convex defects | | Concave defects | | Surface roughness | Convex defects | | Concave defects | | Surface roughness |
| Substrate No. | 60-150 nm | >150 nm | 60-150 nm | >150 nm | Rms (nm) | 60-150 nm | >150 nm | 60-150 nm | >150 nm | Rms (nm) | 60-150 nm | >150 nm | 60-150 nm | >150 nm | Rms (nm) |
| 20 | 3897 | 11 | 2689 | 489 | 0.132 | 4 | 0 | 8841 | 0 | 0.126 | 8 | 1 | 0 | 0 | 0.093 |
| Average | 2707.3 | 8.3 | 9239.1 | 482.7 | 0.1296 | 5.40 | 0.95 | 7533.6 | 0.75 | 0.1279 | 5.85 | 0.70 | 0.65 | 0.10 | 0.0996 |

The following are apparent from Table 2. The sample substrates of the first group, which had been polished with a polishing slurry having an average primary-particle diameter of the colloidal silica of 62-80 nm and having an unregulated pH, had an extremely large number of concave defects and convex defects not smaller than 60 nm and had a surface roughness Rms of 0.130 nm on the average. On the other hand, the sample substrates of the second group, which had been polished with the polishing slurry for the first group after pH regulation to 2, had a considerably reduced number of convex defects although the decrease in the number of concave defects not smaller than 60 nm was not so large. However, the average of the surface roughnesses Rms was substantially the same as that of the first group because the average primary-particle diameter of the colloidal silica was the same.

In contrast, the sample substrates of the third group, which had been polished by the polishing method of the invention, had a reduced number of convex defects as in the second group and an exceedingly reduced number of concave defects unlike the sample substrates of the second group, because of the use of the polishing slurry having an average primary-particle diameter of the colloidal silica of 10-20 nm, and having a pH regulated to 2. In addition, the average of the surface roughnesses Rms was exceedingly low.

Examples

Ninety sample substrates which were the same as those in Reference Example were prepared. These sample substrates were subjected to the same preliminary polishing as in Reference Example and then finish-polished with the same polishing slurry as for the third group shown in Table 1. In this finish polishing, suede pads comprising a 0.8 mm-thick nonwoven-fabric base and a nap layer (see FIG. 4) were used respectively for 30-substrate groups. As these suede pads were used the three polishing pads of Example 1 to Example 3 shown in Table 3. The sample substrates thus polished were washed in the same manner as in Reference Example. Thereafter, a multistage automatic washing machine was used to further wash the edges and surfaces of each substrate with a surfactant solution and a functional water and with a functional water with application of ultrasonic. By this washing, convex defects adherent to the substrates were removed. As a result, substrates having no convex defects having a half-value width of 60 nm or larger and a height of 2 nm or larger could be obtained. In Table 3, the values of the compressibility and compressive modulus of the nap layer of each polishing pad were ones determined respectively with expression 1 and expression 2 given hereinabove. In Table 3, Example 1 and Example 2 are examples according to the invention and Example 3 is a comparative example. The sample substrates finish-polished with the polishing pads of Example 1 to Example 3 are referred to as Example 1 to Example 3, respectively.

TABLE 3

| | Unit | Example 1 | Example 2 | Example 3 | Evaluation method |
|---|---|---|---|---|---|
| Thickness | μm | 550 | 550 | 550 | Schopper type thickness meter |
| Density | g/cm³ | 0.24 | 0.22 | 0.23 | electronic balance |
| Compressibility | % | 30 | 50 | 5 | Schopper type thickness meter |
| Compressive modulus | % | 95 | 98 | 80 | Schopper type thickness meter |

Each thirty sample substrates (Examples 1 to 3), which had been finish-polished respectively with the polishing pads, were inspected with mask blank defect inspection apparatus M1350 (manufactured by Lasertec Corp.) for concave defects. With respect to each sample substrate, ten concave defects were selected in the order of detection. For convenience, numbers of 1 to 10 were assigned to the ten concave defects selected. The width (w in FIG. 2) and depth (nm) of each defect were measured with atomic force microscope SPA 400 (manufactured by Seiko Instrument Inc.) to determine the half-value width (nm). Since convex defects were rare in each sample substrate, concave defects only were examined.

Subsequently, each of the sample substrates of Examples 1 to 3 was examined for surface roughness Rms with atomic force microscope SPA 400, manufactured by Seiko Instrument Inc. Furthermore, the sample substrates of Examples 1 to 3 were examined for concave defects in the following manner. In each Example, the number of defects having a half-value width of 60-150 (nm) and the number of defects having a half-value width larger than 150 (nm) were separately counted for each of the thirty sample substrates and the average number per substrate was calculated.

Each Example was comprehensively evaluated for concave defects from the average number per substrate and surface roughness Rms determined above. The results thereof are shown in Table 4. In the comprehensive evaluation in Table 4, symbol AA indicates that the effect of diminishing concave defects is remarkably observed; A indicates that the effect of diminishing concave defects is observed; and CC indicates that there are an exceedingly large number of concave defects.

The following can be seen from Table 4. The examples of the invention (Example 1 and Example 2), which had been polished with polishing pads employing a nap layer having a compressibility of 10% or higher and a compressive modulus of 85% or higher, were considerably reduced in concave defects as compared with the comparative example (Example 3) and had small values of the half-value width and depth of the concave defects. Namely, these examples had been improved as compared with the comparative example. It can be seen that a substrate having no concave defects having a half-value width of 60 nm or larger and a depth of 2 nm or larger can be obtained.

TABLE 4

|  | Example 1 | | Example 2 | | Example 3 | |
| --- | --- | --- | --- | --- | --- | --- |
| Half-value width (nm) | 60-150 | >150 | 60-150 | >150 | 60-150 | >150 |
| Number of concave defects having depth of 2 nm or larger (per substrate) | 0.47 | 0.1 | 0.30 | 0 | 306 | 80 |
| Surface roughness Rms (nm) | 0.085 | | 0.066 | | 0.182 | |
| Comprehensive evaluation | A | | AA | | CC | |

INDUSTRIAL APPLICABILITY

According to the invention, a glass substrate can be polished so as to have a high-quality surface which has a reduced amount of concave defects and convex defects and has an extremely low surface roughness. The invention is hence suitable for polishing for producing a glass substrate for use as, e.g., a reflective mask or mirror to be used as a part in the optical system of an exposure apparatus for producing semiconductor devices of the 45-nm and succeeding generations.

While the present invention has been described in detail and with reference to specific embodiments thereof, it will be apparent to one skilled in the art that various changes and modifications can be made therein without departing from the spirit and scope thereof.

This application is based on Japanese Patent Application No. 2005-370659 filed Dec. 22, 2005, and the contents thereof are herein incorporated by reference.

The invention claimed is:

1. A glass substrate comprising $SiO_2$ as a main component and having a polished main surface, wherein concave defects and convex defects on the main surface have a depth of 2 nm or smaller and a height of 2 nm or smaller, respectively, and have a half-value width of 60 nm or smaller.

2. The glass substrate of claim 1, wherein the main surface has a surface roughness Rms as determined with an atomic force microscope of 0.15 nm or lower.

3. A mask blank comprising the glass substrate of claim 2.

4. A mask for exposure produced from the mask blank of claim 3.

5. A method comprising exposing a phase shift mask blank comprising the glass substrate of claim 2 with an ArF excimer laser.

6. A method comprising exposing a phase shift mask blank comprising the glass substrate of claim 2 with an $F_2$ excimer laser.

7. A reflective mask blank comprising the glass substrate of claim 2.

8. A mask blank comprising the glass substrate of claim 1.

9. A mask for exposure produced from the mask blank of claim 8.

10. A method comprising exposing a phase shift mask blank comprising the glass substrate of claim 1 with an ArF excimer laser.

11. A method comprising exposing a phase shift mask blank comprising the glass substrate of claim 1 with an $F_2$ excimer laser.

12. A reflective mask blank comprising the glass substrate of claim 1.

13. A method of polishing for producing a glass substrate, which comprises supplying a polishing slurry comprising colloidal silica having an average primary-particle diameter of 60 nm or smaller and water to a gap between a glass substrate comprising $SiO_2$ as a main component and a nap layer of a polishing pad and polishing a main surface of the glass substrate with the nap layer, wherein the nap layer of the polishing pad has a compressibility of 10% or higher and a compressive modulus of 85% or higher to thereby polish the main surface so that concave defects and convex defects on the polished main surface have a depth of 2 nm or smaller and a height of 2 nm or smaller, respectively, and have a half-value width of 60 nm or smaller.

14. The polishing method of claim 13, wherein the polishing slurry has a pH in the range of 0.5-4.

15. The polishing method of claim 13, wherein the polishing pad comprises a base to which the nap layer is attached.

16. The polishing method of claim 13, wherein the colloidal silica has an average primary-particle diameter smaller than 20 nm.

17. The polishing method of claim 13, wherein the polishing slurry further comprises an acid, and has a colloidal-silica content of 10-30% by mass.

18. The polishing method of claim 13, wherein the water is pure water or ultrapure water in each of which the number of fine particles having a maximum diameter of 0.1 μm or larger, as counted by the light-scattering method employing a laser light, is substantially 1 or smaller per mL.

19. The polishing method of claim 13, further comprising washing the polished glass substrate with a solution of a surfactant after the polishing step with the polishing slurry.

20. The polishing method of claim 13, further comprising preliminary polishing of the surface of the glass substrate before the polishing step with the polishing slurry.

* * * * *